United States Patent

[11] 3,629,088

[72] Inventors Robert I. Frank
Cambridge;
William L. Moberg, Chelmsford, both of Mass.

[21] Appl. No. 744,186
[22] Filed July 11, 1968
[45] Patented Dec. 21, 1971
[73] Assignee Sperry Rand Corporation
Great Neck, N.Y.

[54] SPUTTERING METHOD FOR DEPOSITION OF SILICON OXYNITRIDE
6 Claims, 3 Drawing Figs.

[52] U.S. Cl. 204/192
[51] Int. Cl. C23c 15/00
[50] Field of Search 204/192; 117/106, DIG. 12

[56] References Cited

UNITED STATES PATENTS 3,422,321 1/1969 Tombs 317/235
3,485,666 12/1969 Sterling et al. 204/192

OTHER REFERENCES

Brown et al., " Properties of Si OyWz Films on Si" J. of Electrochemical Society, Vol. 115, No. 3 pg. 311-317, 3/68

S. M. Hu et al., J. Electrochem. Soc., Vol. 114, No. 8, August 1967, pp. 826-832

*Primary Examiner*—John H. Mack
*Assistant Examiner*—Sidney S. Kanter
*Attorney*—S. C. Yeaton

ABSTRACT: Low temperature deposition of silicon oxynitride on an integrated circuit device is accomplished by the reactive sputtering of high-purity silicon source material in the presence of nitrous oxide and nitrogen. The deposited silicon oxynitride is characterized by an etch rate, breakdown strength and yield higher than those of silicon nitride and a dielectric constant higher than that of silicon oxide.

INVENTORS
ROBERT I. FRANK
WILLIAM L. MOBERG
BY
Robert J. Haase
ATTORNEY

INVENTORS
ROBERT I. FRANK
WILLIAM L. MOBERG
BY
ATTORNEY

SPUTTERING METHOD FOR DEPOSITION OF SILICON OXYNITRIDE

BACKGROUND OF THE INVENTION

Silicon nitride has been studied extensively as a dielectric material for use in the making of passive components in integrated circuits. Silicon nitride is of interest because of its compatibility with integrated circuits and its high dielectric constant and dielectric strength with respect to silicon oxide. Inasmuch as passive components in integrated circuits are formed at a time after certain metallization has been placed on the circuit devices, it is mandatory that the process for the deposition of silicon nitride take place at low temperatures noninjurious to the existing metallization. Silicon nitride has been deposited by the low the low-temperature reactive sputtering of silicon source material onto a substrate in the presence of a nitrogen atmosphere. However, the relatively low etching rate of silicon nitride limits its use in integrated circuit work except as a final encapsulant.

SUMMARY OF THE INVENTION

In accordance with the present invention, silicon oxynitride is deposited at low temperatures on an integrated circuit device by the reactive sputtering of high purity silicon source material in the presence of a nitrogen and a nitrogen-oxygen gaseous compound. Said compound preferably is nitrous oxide. The deposited silicon oxynitride is characterized by a relatively larger etching rate and a dielectric constant favorably comparable to that of silicon nitride. In addition, it has been ascertained that the breakdown strength of the sputtered silicon oxynitride is significantly superior to that of sputtered silicon-nitride and is achieved with substantially higher yield.

DESCRIPTION OF THE PREFERRED EMBODIMENT

Figure 1:
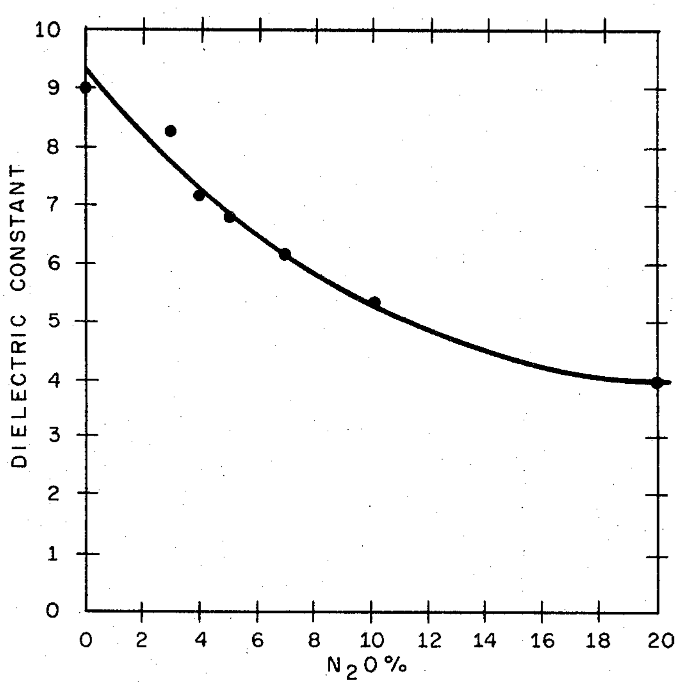
FIG. 1 is a curve depicting the variation in dielectric constant of sputtered silicon oxynitride made in accordance with the present invention as a function of the amount of nitrous oxide in the sputtering gas.

The method of the present invention preferably employs a conventional sputtering unit. The sputtering unit is equipped with filament, anode and target elements and a controlled gas atmosphere for the radiofrequency reactive sputtering of thin films on substrates including microcircuit devices. A magnetic coil mounted outside the sputtering chamber controls the plasma density of the gas atmosphere inside the chamber. The method of radiofrequency sputtering (wherein radiofrequency energy is applied to the target element) is preferred because of the superior film properties obtained relative to direct current sputtering methods. Reactive sputtering is preferred because of the availability of high purity silicon source material and the capability of varying the composition of the deposited film by controlling the composition of the reactant gas. A suitable sputtering unit is available on the commercial market from the Consolidated Vacuum Corporation, of Rochester, New York, under the name "PlasmaVac."

In a preferred species of the present invention, the reactant gases within the sputtering chamber comprise nitrous oxide and nitrogen. The nitrous oxide provides a source of oxygen which is preferred over the use of pure oxygen because the former permits the use of much larger quantities of the oxygen-containing gas for ease of control in mixing with the nitrogen. For example, it has been found that sputtering in a mixture of 5% $O_2$ and 95% $N_2$ shifts the maximum of the infrared absorption characteristics of deposited silicon oxynitride from 12 microns (as is obtained when using only $N_2$) to 9.3 microns which is characteristic of silicon dioxide. A mixture of over 20% $N_2O$ in $N_2$ was found necessary to cause the same shift in the infrared absorption maximum.

In a typical use of the method of the present invention, a - inch inch diameter high purity polycrystalline silicon source material as employed as the target element and a one ohm-centimeter N-type silicon wafer is employed as the substrate within the sputtering chamber. The gas atmosphere within the chamber chamber comprises nitrous oxide ($N_2O$) and nitrogen. Sputtered silicon oxynitride has been deposited on bare silicon wafers as well as on metal electrode-coated wafer devices. In either case, the oxynitride deposition is followed by the deposition of a top metal electrode to form a capacitor with the original metal electrode or the bar silicon substrate. Deposition of sputtered silicon oxynitride onto a metal film is more difficult than deposition directly onto silicon. Successful deposits were produced, however, on molybdenum and aluminum metal films.

The sputtering chamber preferably is evacuated down to a pressure of $1\times10^{-7}$ torr before admitting the sputtering gas. $N_2O$ is admitted first in an amount to increase the pressure to 0.15 microns as observed using an ion gauge inasmuch as the flow rate of $N_2O$ is usually too small to register on a flowmeter. $N_2$ is then admitted into the sputtering chamber to increase the total pressure of the gas atmosphere to 3 microns at room temperature. Thus, the total reactant gas comprises 5 mole % $N_2O$ (5 percent of 3 microns) and 95 mole % $N_2$ (95 percent of 3 microns). The magnetic coil mounted on the outside of the sputtering chamber is energized to provide a magnetic field of 25 gauss. The foregoing typical sputtering parameters provide a deposition rate of about 120 angstroms per minute on the substrate where the silicon source material (target) to substrate distance is 2-½ inches.

It has been found that the etching rate of the deposited material as well as the dielectric constant thereof change monotonically between values corresponding to those of pure silicon nitride and those corresponding to pure silicon oxide as the quantity of $N_2O$ in the reactant gas is increased. The variation in the value of the dielectric constant of the deposited silicon oxynitride film is shown in FIG. 1 as a function of the mole percentage of nitrous oxide in the gas atmosphere. The data depicted in FIG. 1 was obtained by depositing sputtered silicon oxynitride on a silicon wafer coated with molybdenum and having molybdenum top electrodes. The corresponding etching rate variation for additions of $N_2O$ to the gas atmosphere from 0 mole % $N_2O$ to 20 mole % $N_2O$ ranges from the value of 20.5 angstroms per minute to a value of 1,180 angstroms per minute in 7:1 buffered hydrofluoric acid as shown in the first two columns of the following table:

| %$N_2O$ | Etch Rate A./min. | Breakdown Field v./cm. $\times10^6$ | Figure of Merit |
|---|---|---|---|
| 0 | 20.5 | 6.0 | 5.46 |
| 1 | 41.7 | 6.9 | 6.0 |
| 3 | 143 | 9.3 | 7.7 |
| 4 | 167 | 10.1 | 7.3 |
| 5 | 225 | 10.1 | 6.87 |
| 7 | 305 | 10.1 | 6.16 |
| 10 | 587 | 10.9 | 5.78 |
| 15 | 900 | 10.0 | 4.4 |
| 20 | 1,180 | 8.3 | 3.32 |

Figure 2:
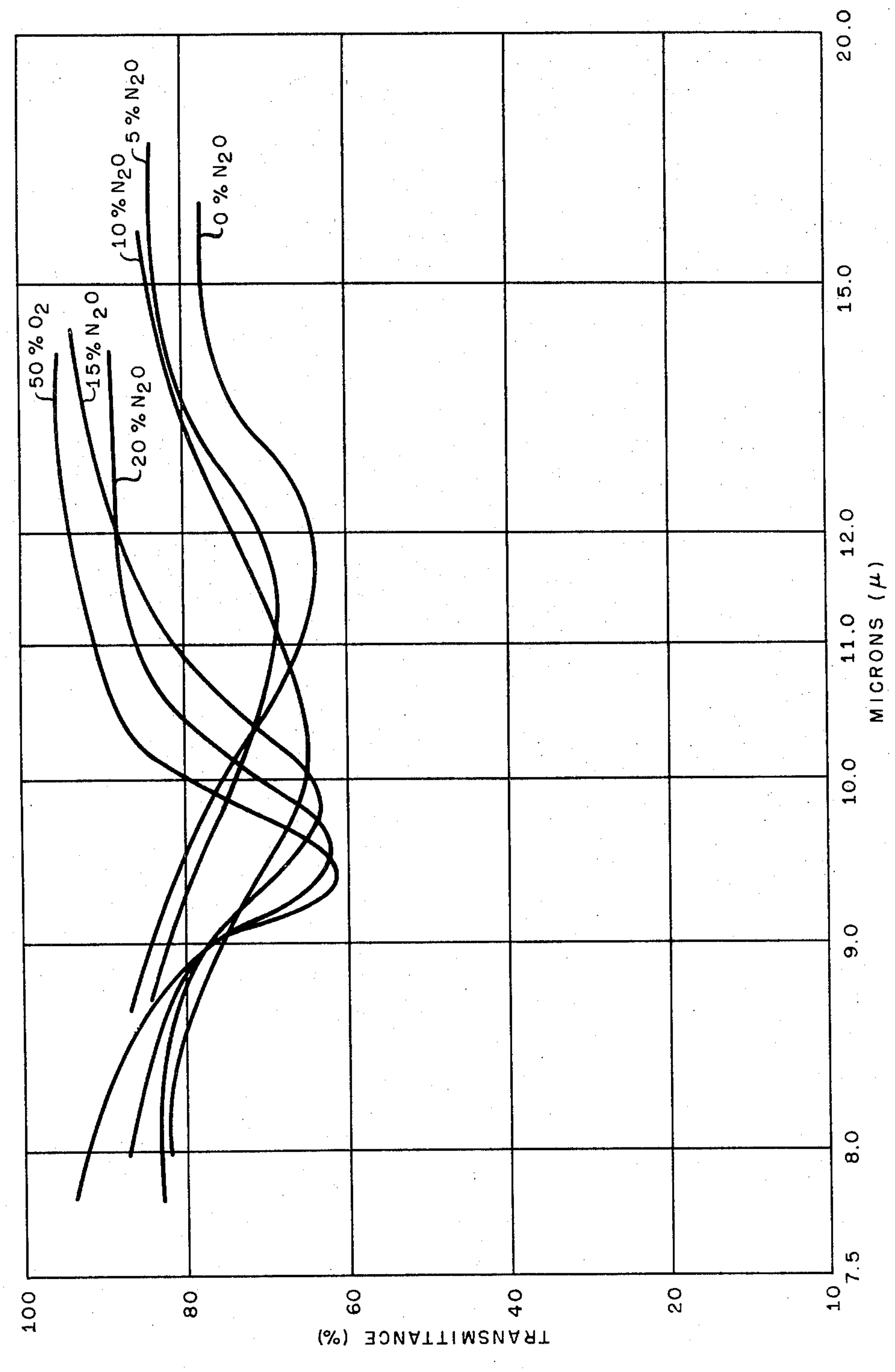
FIG. 2 is a set of superimposed curves showing the infrared transmission spectra of sputtered silicon oxynitride made in accordance with the present invention as a function of the amount of nitrous oxide in the sputtering gas.

A comparison between the infrared transmission spectra of silicon dioxide and of the deposited silicon oxynitride resulting from various mole percentages of $N_2O$ in the reactant gas is shown in FIG. 2. The addition of 50 percent pure oxygen to the reactant gas gives essentially the same infrared transmission spectrum and etching rate as pure thermally grown silicon dioxide. Thus, it can be seen that the addition of 20% $N_2O$ to the reactant gas yields a distinguishable infrared transmission characteristic with respect to the pure thermally grown silicon dioxide. The employment of $N_2O$ concentrations less than 20 percent result in more pronounced deviations from the infrared transmission characteristic of pure thermally grown silicon dioxide.

The variation in the dielectric constant and in the infrared transmission spectrum of the deposited silicon oxynitride as a function increasing $N_2O$ concentrations in the reactant gas depicted in FIGS. 1 and 2, respectively, are uniform variations as might be expected. However, the same is not true of the dielectric strength and yield properties of the sputtered silicon oxynitride as a function of variations in the $N_2O$ concentration. Dielectric strength and yield exhibit maximum values where the $N_2O$ mole percentages in the reactant gas is in the range from about 5 to about 10 percent. The former is depicted in the third column of the foregoing table. The latter is shown in FIG. 3.

Yield is defined as the percentage of silicon oxynitride capacitors, made in accordance with the present invention, which break down in a given range of the most probable breakdown point as determined from a breakdown distribution plot. FIG. 3 shows a series of breakdown distribution plots for $N_2O$ additions of between 0 mole percent and 20 mole percent to the $N_2$ reactant gas. The curves of FIG. 3 were plotted from the number of capacitors breaking down in a particular 10-volt range versus the midpoint of that range. For example, the number of capacitors breaking down at a voltage between 130 and 140 volts is placed on the ordinate at 135 volts. A smooth curve then is drawn through the points which are plotted in this manner. Each curve is based on a sample of 50 to 100 capacitors selected at random from a large number formed on a common substrate. The capacitors were formed by depositing a molybdenum bottom electrode on a silicon nitride coated silicon wafer. The bottom electrode was then covered by about 1,500 A. of sputtered silicon oxynitride made in accordance with the present invention. A molybdenum top electrode was deposited on the sputtered silicon oxynitride and the top electrode was etched into small diameter dots. Each dot formed a capacitor sharing a respective portion of the same bottom electrode and a respective portion of the same silicon oxynitride dielectric material. Each of the curves represents the breakdown distribution plot of randomly selected capacitors sharing the same silicon oxynitride produced using a respective concentration of $N_2O$ in the reactant gas.

Figure 3:
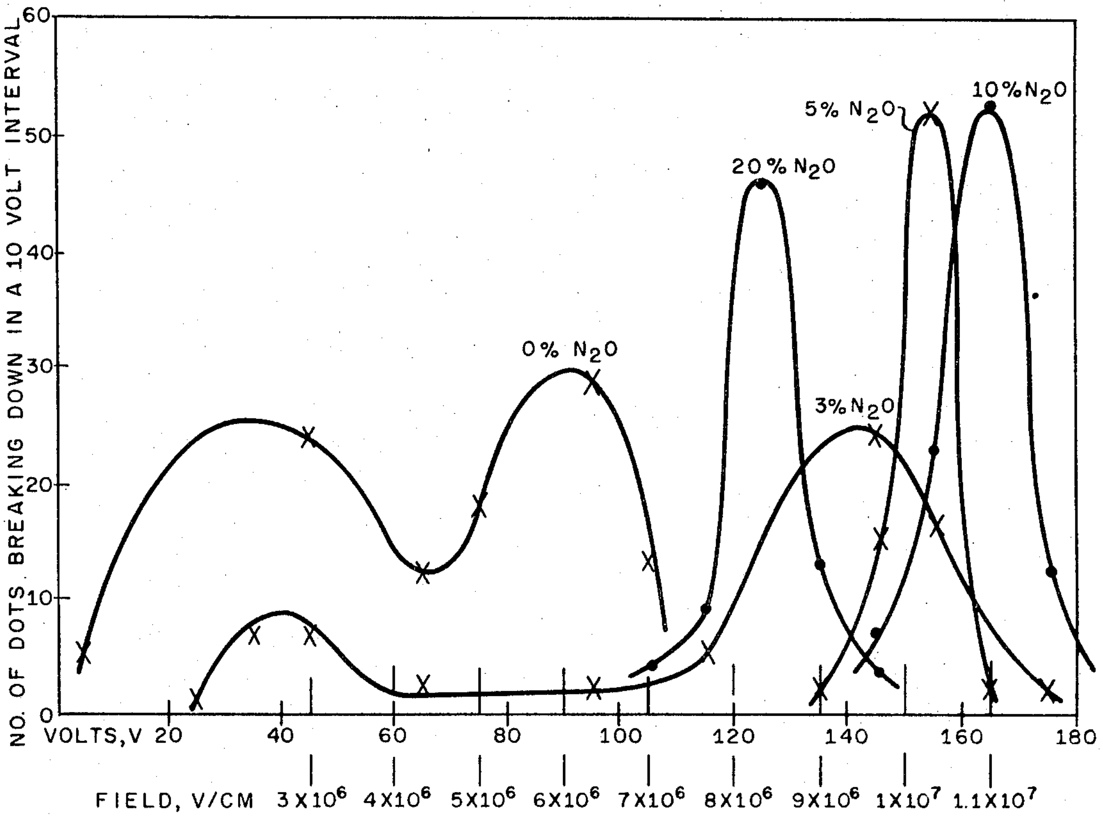
FIG. 3 is a set of superimposed curves depicting the breakdown voltage distributions of capacitors using dielectric material made in accordance with the present invention as a function of the amount of nitrous oxide in the sputtering gas.

The curve of FIG. 3 representing a 0% $N_2O$ addition to the reactant gas shows a characteristic double peak structure, probably indicating the presence of two distinct breakdown mechanisms. The first peak occurs at an electric field gradient of about $3\times10^6$ volts per centimeter whereas the second peak occurs at $6\times10^6$ volts per centimeter. With 3% $N_2O$ in the reactant gas, the deposited silicon oxynitride exhibits a first amplitude peak occurring at about $3\times10^6$ volts per centimeter and a second peak occurring at the much higher value of about $9\times10^6$ volts per centimeter. With 5% $N_2O$ in the reactant gas, the first peak appears to have vanished while the second peak is narrowed and shifted to still higher values. For $N_2O$ additions in excess of 15 percent, the single peaked breakdown distribution curve remains but it becomes somewhat broader and the breakdown voltage gradient at the peak decreases to about $9\times10^6$ volts per centimeter. The curve for the 20% $N_2O$ addition illustrates this behavior.

A sharply peaked breakdown distribution plot signifies that a high capacitor yield is obtained. For use in the making of capacitors in integrated circuits, the lowest $N_2O$ addition consistent with a high yield is desirable because the lower the percentage of $N_2O$ employed in the reactant gas the greater is the dielectric constant of the deposited silicon oxynitride. Thus, $N_2O$ additions from 3 percent to 5 percent are preferred as may be seen by reference to FIGS. 1 and 3. However, the entire range of $N_2O$ additions from about 3 percent to about 15 percent yields desirable values of breakdown, yield, etching rate and dielectric constant. For $N_2O$ additions below about 3 percent, the breakdown and yield become undesirably low. For $N_2O$ additions above about 15 percent, there is no significant advantage of the sputtered silicon oxynitride over prior art silicon dioxide as can be seen from the values of the figures of merit in the last column of the foregoing table. The figure of merit value is proportional to the product of the breakdown field and the dielectric constant and thus proportional to the maximum capacitance per unit area obtainable with a particular dielectric.

It should be noted that the mole percentages of $N_2O$ given above were established on the basis of the partial pressures of the $N_2O$ alone and the mixture of $N_2O$ and $N_2$ in the sputtering chamber as measured on standard ion and Pirani gauges. Said percentages can also be defined on the basis of the positions of the infrared transmission maximums plotted in FIG. 2. For example, a 15% $N_2O$ addition to the reactant gas produces a corresponding infrared transmission maximum at 9.9 $\mu$.

While the invention has been described in its preferred embodiment, it is to be understood that the words which have been used are words of description rather than limitation and that changes within the purview of the appended claims may be made without departing from the true scope and spirit of the invention in its broader aspects.

We claim:

1. The method of depositing silicon oxynitride on a substrate comprising the steps of
   - placing a source of silicon in a sputtering unit,
   - placing said substrate in said unit,
   - evacuating said unit to a pressure of about $1\times10^{-7}$ torr,
   - placing a mixture of nitrogen and nitrous oxide in said unit, said mixture having a pressure of about 3 microns at room temperature,
   - the mole percentage of said nitrous oxide in said mixture being in the range from about 3 to about 15,
   - establishing a plasma in the region between said source and said substrate, and
   - applying an alternating voltage to said source, said voltage having an amplitude sufficient to reactively sputter said silicon onto said substrate in the presence of said mixture.

2. The method defined in claim 1 wherein said substrate is a semiconductor material.

3. The method defined in claim 2 wherein said semiconductor material is silicon.

4. The method defined in claim 3 wherein said silicon is coated with a metal.

5. The method defined in claim 4 wherein said metal is molybdenum.

6. The method defined in claim 5 wherein said range is from about 3 to about 5.

* * * * *